US012646680B2

(12) United States Patent
Mizumura

(10) Patent No.: US 12,646,680 B2
(45) Date of Patent: Jun. 2, 2026

(54) FOCUSED ION BEAM SYSTEM

(71) Applicant: V TECHNOLOGY CO., LTD.,
Kanagawa (JP)

(72) Inventor: Michinobu Mizumura, Kanagawa (JP)

(73) Assignee: V TECHNOLOGY CO., LTD.,
Kanagawa (JP)

( * ) Notice: Subject to any disclaimer, the term of this patent is extended or adjusted under 35 U.S.C. 154(b) by 314 days.

(21) Appl. No.: 18/560,013

(22) PCT Filed: Feb. 25, 2022

(86) PCT No.: PCT/JP2022/007984
§ 371 (c)(1),
(2) Date: Nov. 9, 2023

(87) PCT Pub. No.: WO2022/249605
PCT Pub. Date: Dec. 1, 2022

(65) Prior Publication Data
US 2024/0242924 A1     Jul. 18, 2024

(30) Foreign Application Priority Data

May 28, 2021     (JP) ................................. 2021-090128

(51) Int. Cl.
*H01J 37/153*          (2006.01)
*H01J 37/21*           (2006.01)
(Continued)

(52) U.S. Cl.
CPC ............ *H01J 37/153* (2013.01); *H01J 37/21* (2013.01); *H01J 37/244* (2013.01); *H01J 37/28* (2013.01)

(58) Field of Classification Search
CPC ......... H01J 37/00; H01J 37/02; H01J 37/153; H01J 37/20; H01J 37/21; H01J 37/244;
(Continued)

(56) References Cited

U.S. PATENT DOCUMENTS

2006/0289781 A1     12/2006   Tanimoto et al.
2007/0257207 A1*    11/2007   Frosien ................... H01J 37/09
                                                                250/492.3
(Continued)

FOREIGN PATENT DOCUMENTS

JP          2007-012306 A       1/2007
JP          2010-205539 A       9/2010
(Continued)

OTHER PUBLICATIONS

Notice of Reasons for Refusal mailed on Sep. 24, 2024, issued for the corresponding Japanese Patent Application No. 2021-090128, 10 pages, with English translation.
(Continued)

*Primary Examiner* — Jason L Mccormack
(74) *Attorney, Agent, or Firm* — LUCAS & MERCANTI, LLP

(57) ABSTRACT

A condenser lens works to process an ion beam into a collimated form. An electrical aperture unit is disposed between the condenser lens and the objective lens. The electrical aperture unit works to alter an area through which the ion beam, as processed by the condenser lens, passes, thereby controlling a diameter of the ion beam. A plurality of beam shielding plate units are provided each of which includes a pair of beam shielding plates which are diametrically opposed to each other across the ion beam which has passed through the condenser lens. The beam shielding plates are movable in a direction perpendicular to an optical axis of the ion beam. The beam shielding plate units are arranged around the ion beam to define a diameter of the ion beam passing therethrough.

8 Claims, 6 Drawing Sheets

(51) Int. Cl.
  *H01J 37/244* (2006.01)
  *H01J 37/28* (2006.01)

(58) Field of Classification Search
  CPC .. H01J 37/26; H01J 37/28; H01J 37/09; H01J 2237/0456; H01J 2237/31749
  USPC .................... 250/396 R, 492.1, 492.2, 492.3
  See application file for complete search history.

(56) References Cited

U.S. PATENT DOCUMENTS

| | | | | |
|---|---|---|---|---|
| 2008/0149857 A1* | 6/2008 | Ferrara | ................... | H01J 37/09 |
| | | | | 250/492.21 |
| 2008/0185514 A1* | 8/2008 | Frosien | ................... | H01J 37/08 |
| | | | | 250/288 |
| 2010/0224781 A1 | 9/2010 | Hosokawa | | |

| | | | | |
|---|---|---|---|---|
| 2012/0181444 A1 | 7/2012 | Tahmassebpur | | |
| 2016/0240350 A1* | 8/2016 | Lane | ....................... | H01J 37/08 |
| 2020/0343073 A1 | 10/2020 | Okazawa et al. | | |

FOREIGN PATENT DOCUMENTS

| | | |
|---|---|---|
| JP | 2020-064788 A | 4/2020 |
| JP | 2020-181902 A | 11/2020 |

OTHER PUBLICATIONS

International Search Report dated May 17, 2022, for the corresponding patent application No. PCT/JP2022/007984, with English translation.

Office Action issued on Apr. 26, 2026 for the corresponding Chinese patent application No. 202280031636.X, 11 pages, with English translation.

* cited by examiner

FOCUSED ION BEAM SYSTEM

CROSS REFERENCE TO RELATED APPLICATION

This Application is a 371 of PCT/JP2022/007984 filed on Feb. 25, 2022, which claimed priority of Japanese Application No. 2021-090128 filed on May 28, 2021, both of which are incorporated herein by reference.

TECHNICAL FIELD

The present invention generally relates to a focused ion beam system.

BACKGROUND ART

Known focused ion beam systems are usually designed to focus an ion beam on a surface of a target using an electrostatic lens system which includes a double lens assembly made of a condenser lens and an objective lens. The ion beam is produced by ionizing liquid metal, such as gallium, using a field emission technique. The ion beam is emitted from a head of a liquid metal ion source, accelerated by acceleration voltage (or partially by ion overvoltage), spreads at a given angle in a cone-shape, and then enters the condenser lens. After entering the condenser lens, the ion beam is changed in trajectory depending upon an electrical field distribution to reduce the spread of the ion beam, thereby shaping the ion beam to have an emission angle smaller than the above given angle.

For instance, Patent Literature 1 teaches a focused ion beam system in which orifices are arranged upstream and downstream of a condenser lens. The orifice located downstream of the condenser lens is capable of selectively creating one of a plurality of openings different in diameter from each other. In other words, the downstream orifice is designed to control an area of an opening through which the ion beam which is radially shaped in the above manner passes. In the focused ion beam system, after passing through the downstream orifice, the ion beam is focused by the objective lens and then reaches the target.

PRIOR ART DOCUMENT

Patent Literature

Patent Literature 1: Japanese Patent First Publication No. 2020-64788

SUMMARY OF THE INVENTION

Problem to be Solved by the Invention

In the above-described focused ion beam system, the ion beam which has passed through the condenser lens reaches the downstream orifice while keeping the radial shape thereof. The radial-shaped ion beam usually has an imbalance in quantity of ions passing through a plane defined to extend perpendicular to an optical axis of the ion beam. This causes the ion beams, as having passed through the downstream orifice, to have characteristics changing with a change in diameter of the opening of the orifice, thereby requiring a need for the focused ion beam system to regulate an astigmatism alignment voltage and an axis aligner voltage individually each time the opening of the downstream orifice is changed in diameter thereof. This undesirably requires a large amount of time to regulate a current value of the ion beam.

The present invention was made in view of the above problem. It is an object of the invention to provide a focused ion beam system capable of controlling a current value of an ion beam quickly and accurately.

Means for Solving the Problem

In order to solve the above problem and achieve the object, there is provided a focused ion beam system according to one aspect of the invention. The focused ion beam system comprises: (a) a liquid metal ion source: (b) a condenser lens which processes an ion beam generated by the liquid metal ion source: and (c) an objective lens which focuses the ion beam which has passed through the condenser lens and emit the ion beam onto a surface of a sample. The condenser lens works to process the ion beam into a collimated form. An electrical aperture unit is disposed between the condenser lens and the objective lens. The electrical aperture unit works to alter an area through which the ion beam, as processed by the condenser lens, passes to control a diameter of the ion beam. The electrical aperture unit includes a plurality of beam shielding plate units. Each of the beam shielding plate units is equipped with a pair of beam shielding plates which are diametrically opposed to each other across the ion beam which has passed through the condenser lens and movable in a direction perpendicular to an optical axis of the ion beam. The beam shielding plates of the beam shielding plate units are arranged around the ion beam to define the area through which the ion beam passes. The plurality of beam shielding plate units are offset from each other in a direction in which the optical axis of the ion beam extends.

In the above mode, an astigmatism alignment device may be preferably disposed downstream of the electrical aperture unit. The astigmatism alignment device includes a plurality of pole lens arranged around the ion beam. The electrical aperture unit includes the beam shielding plates which are identical in number with the pole lens.

In the above mode, the electrical aperture unit may be preferably designed to have the four beam shielding plate units which are located at an angular interval of 45 degrees away from each other around the optical axis of the ion beam in a circumferential direction of the ion beam, as viewed in the direction in which the optical axis of the ion beam extends.

In the above mode, the beam shielding plate units may be preferably configured to have the beam shielding plates synchronously movable close to or away from each other at the same distance from the optical axis of the ion beam.

In the above mode, the beam shielding plate units may be preferably designed to be synchronously movable.

In the above mode, the electrical aperture unit may be preferably designed to continuously alter the area through which the ion beam passes.

In the above mode, the beam shielding plate units may be preferably arranged to define an aperture of a polygonal shape whose peripheral edge is regularly altered around the optical axis of the ion beam in a direction in which an electrical field is controlled by the astigmatism alignment device, viewed in the direction in which the optical axis of the ion beam extends.

In the above mode, each of the beam shielding plates of the electrical aperture unit may be preferably arranged in alignment with a respective one of the pole lens, as viewed in the direction in which the optical axis of the ion beam extends.

The above mode may further comprise a selective aperture plate which has formed therein a plurality of apertures whose diameter are different from each other to selectively control the diameter of the ion beam.

Beneficial Advantages of the Invention

The above focused ion beam system according to the invention ensures the accuracy in controlling an electrical current in an ion beam in a short time.

MODE FOR CARRYING OUT THE INVENTION

Referring to the accompanying drawings, various embodiments are described below. The drawings schematically show focused ion beam systems, so each of the members constituting each of the systems is different from what is real in size, in dimensional ratio, in number of its parts, in configuration and the like. In addition, the drawings contain portions which are the same but different in size, dimensional ratio, and configuration.

The focused ion beam systems find application in repairing a substrate, such as a photomask, a TFT substrate. The focused ion beam systems also find application in an electron-beam lithography system that allows you to draw a custom pattern on a substrate, a scanning electron microscope that enables you to observe the condition of the surface of a substrate by producing images of the surface by scanning the surface with a focused beam of electrons, and the like.

First Embodiment

Structure of Focused Ion Beam System

Figure 1:
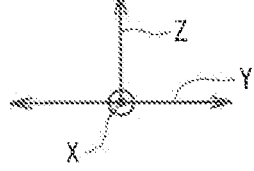
FIG. 1 is an explanatory view which schematically illustrates a structure of a focused ion beam system according to the first embodiment of the invention.

FIG. 1 schematically illustrates the focused ion beam system 1. The focused ion beam system 1 includes the focused ion beam column (which will also be referred to as FIB) 2 and the controller 13. The substrate support base 15 on which the target or sample S is mounted is arranged below the FIB column 2. The focused ion beam system 1 also includes an X-Y stage which moves the substrate support base 15 in X- and Y-directions and an elevating mechanism which moves the substrate support base 15 in a Z-direction.

The FIB column 2 is connected to a vacuum pump, not shown, which works to keep the inside of the FIB column 2 at a selected low pressure. The FIB column 2 has the liquid metal ion source 3, the condenser lens 4, the electrical aperture unit 5, the astigmatism alignment device 6, the blanker 7, the blanking aperture 8, the deflector 9, the objective lens 10, the secondary charged particle detector 11, and the deposition gas supply pipe 12 arranged therein in this order.

The liquid metal ion source 3 stores liquid metal, such as gallium (Ga) stored therein. The liquid metal ion source 3 ionizes the liquid metal using the field emission technique and discharges it from the head thereof. The gallium ions (Ga+) emitted from the liquid metal ion source 3 is accelerated at acceleration voltage (or partially by ion overvoltage) by extraction electrodes arranged on the uppermost-stream side of the condenser lens 4 in the form of an ion beam IB with a given emission angle.

The condenser lens 4 is made of an electrostatic lens and functions to collimate the inputted ion beam IB into the ion beam IBp.

Figure 2A:
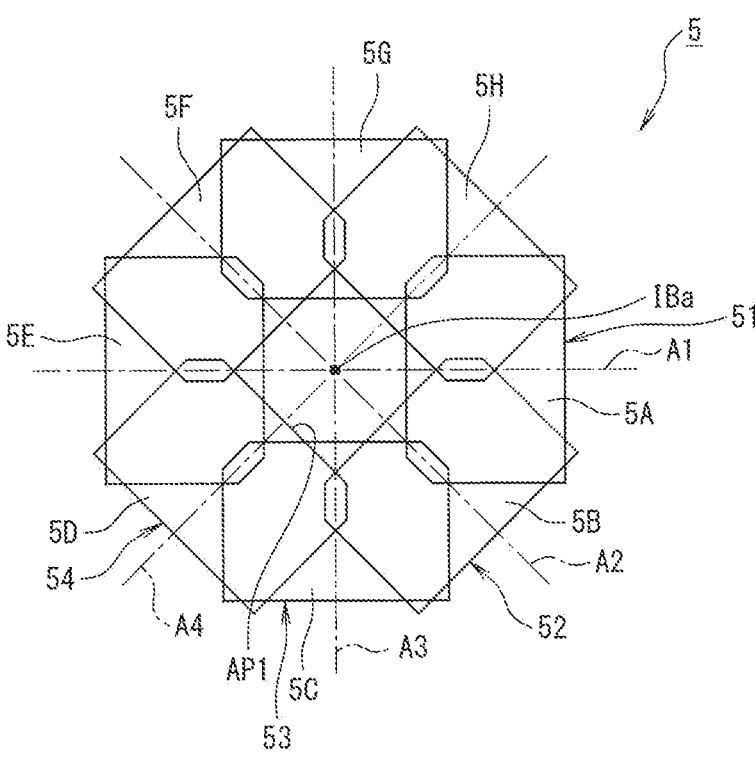
FIG. 2A is an explanatory view which demonstrates an increased area of an electrical aperture unit through which an ion beam passes, as viewed in a direction in which an optical axis of the ion beam extends.

The electrical aperture unit 5 is, as can be seen in FIGS. 1 and 2A, equipped with four beam shielding plate units 51, 52, 53, and 54 which are movable in a direction perpendicular to an optical axis of the ion beam IB. The beam shielding plate units 51, 52, 53, and 54 are offset from each other in the optical axis direction of the ion beam IBp. FIG. 1 illustrates the directions A1, A2, A3, and A4 as being oriented in the same direction for the brevity of illustration, but however, they are, as can be seen in FIG. 2A, 45 degrees away from each other around the optical axis IBa in a circumferential direction of the ion beam IB.

Figure 2B:
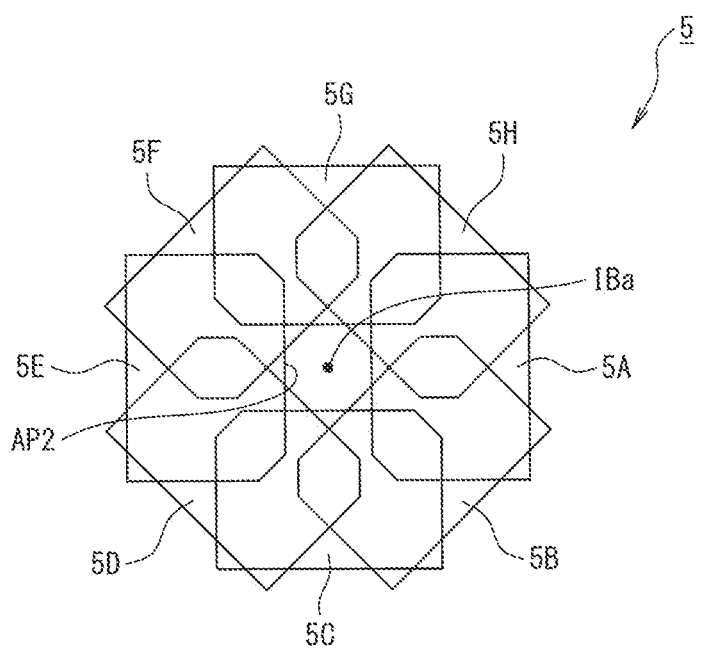
FIG. 2B is an explanatory view which demonstrates a decreased area of an electrical aperture unit through which an ion beam passes, as viewed in a direction in which an optical axis of the ion beam extends.
Figure 3:
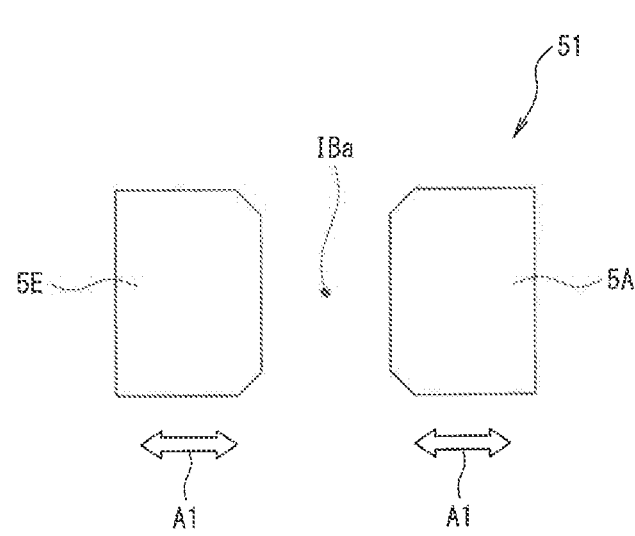
FIG. 3 is an explanatory view which demonstrates operation of a beam shielding plate unit installed in a focused ion beam system according to the first embodiment of the invention.

FIG. 3 is a projection view of the beam shielding plate unit 51, as viewed in a direction in which the optical axis IBa of the ion beam IBp extends. The beam shielding plate unit 51 is, as can be seen in FIGS. 2A and 3, equipped with a pair of beam shielding plates 5A and 5E. The beam shielding plate unit 52 is, as illustrated in FIG. 2A, equipped with a pair of beam shielding plates 5B and 5F. The beam shielding plate unit 53 is equipped with a pair of beam shielding plates 5C and 5G. The beam shielding plate unit 54 is equipped with a pair of beam shielding plates 5D and 5H. Although FIGS. 2A and 2B illustrate the beam shielding plates 5A to 5H as partially overlapping each other, they are all denoted by solid lines for the sake of convenience.

The beam shielding plates 5A and 5E of the beam shielding plate unit 51 are diametrically opposed to each other across the ion beam IBp which has passed through the condenser lens 4 into a collimated form. In other words, the beam shielding plates 5A and 5E are arranged on the opposite sides of the optical axis IBa and extend in the direction A1 perpendicular to the optical axis IBa. The beam shielding plates 5A and 5E are synchronously movable close to or away from each other in the direction A1. The movement of the beam shielding plates 5A and 5E in the direction A1 is achieved by an actuator, not shown.

The beam shielding plate unit 51 works to move the beam shielding plates 5A and 5E close to or away from each other to change an area of zone through which the ion beam IBp passes uniformly from opposite sides of the zone. It is also possible to move the beam shielding plates 5A and 5E backward away from each other to positions where they optically interfere with the ion beam IBp.

Each of the beam shielding plate units 52, 53, and 54 has the same structure as that of the beam shielding plate unit 51. The beam shielding plate unit 52 is, however, designed to, as can be seen in FIG. 2A, have the beam shielding plates 5B and 5F movable in the direction A2. The direction A2 is oriented at an angular interval of 45° away from the direction A1 clockwise, as viewed in FIG. 2A, around the optical axis IBa of the ion beam IBp.

The beam shielding plate unit 53 is, as can be seen in FIG. 2A, designed to have the beam shielding plates 5C and 5G movable in the direction A3. The direction A3 is oriented at an angular interval of 45° away from the direction A2 clockwise, as viewed in FIG. 2A, around the optical axis IBa of the ion beam IBp.

The beam shielding plate unit 54 is, as can be seen in FIG. 2A, designed to have the beam shielding plates 5D and 5H movable in the direction A4. The direction A4 is oriented at an angular interval of 45° away from the direction A3 clockwise, as viewed in FIG. 2A, around the optical axis IBa of the ion beam IBp.

The above structure of the electrical aperture unit 5 works to control the movement of the eight beam shielding plates 5A to 5H of the beam shielding plate units 51, 52, 53, and 54 to continuously change the diameter of the aperture AP. The aperture AP is of a polygonal shape whose peripheral edge is regularly varied around the optical axis IBa of the ion beam IBp in a direction in which an electrical field is controlled by the astigmatism alignment device 6. In this embodiment, the aperture AP is capable of continuously change an area in which the ion beam IBp passes with high accuracy although not circular.

The ion beam IBp passes through the electrical aperture unit 5, so that the diameter thereof is regulated into the ion beam IBt. FIG. 2A demonstrates the electrical aperture unit 5 whose aperture AP is increased in diameter into an aperture AP1. In this embodiment, the diameter of the aperture AP may be set to be more than that of the ion beam IBp. FIG. 2B demonstrates the electrical aperture unit 5 whose aperture AP is decreased in diameter into an aperture AP2. In this condition, the diameter of the ion beam IBp is decreased by the electrical aperture unit 5.

Figure 4:
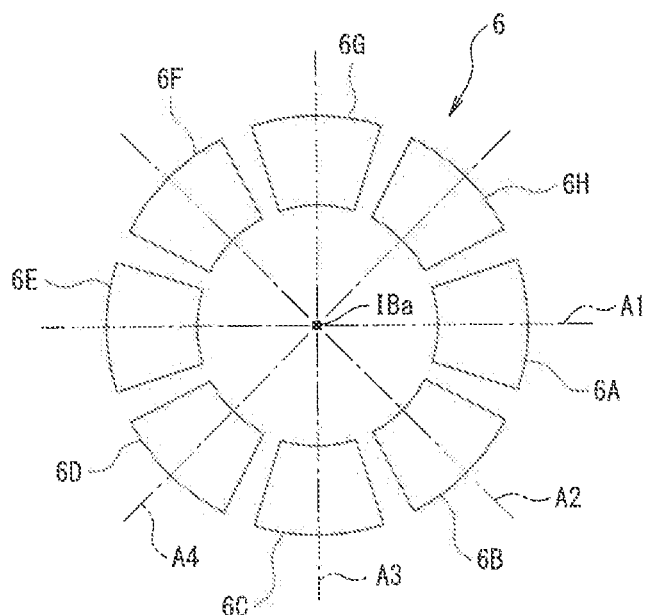
FIG. 4 is a plane view which illustrates an astigmatism alignment device installed in a focused ion beam system according to the first embodiment of the invention.

The astigmatism alignment device 6 in this embodiment is, as clearly illustrated in FIG. 4, made of a combination of two sets of quadrupole lens including octapole lens 6A, 6B, 6C, 6D, 6E, 6F, 6G, and 6H. The two sets of quadrupole lens are located 45° away from each other around the optical axis IBa of the ion beam IBt. The lens 6A, 6B, 6C, 6D, 6E, 6F, 6G, and 6H are also arranged at an angular interval of 45° away from each other. The degree of correction for the ion beam IBt and the direction in which the ion beam IBt is corrected are changed by changing values of current flowing through the two sets of quadruple lens and a ratio thereof. Each of the eighth beam shielding plates 5A to 5H of the electrical aperture unit 5 is arranged in alignment with a respective one of the multipole lens 6A to 6H.

The blanker 7 is responsive to application of blanking voltage thereto to deflect the ion beam IBt to a light shielding portion (i.e., a non-opening area) of the blanking aperture 8 without directing the ion beam IBt toward the sample S.

The deflector 9 works to deflect the ion beam IBt which has passed through the electrical aperture unit 5 to steer it in the X-Y direction. The objective lens 10 is controlled to focus the ion beam IBt on the upper surface (which will also be referred to as a sample surface) of the sample S.

The secondary charged particle detector 11 and the deposition gas supply pipe 12 are, as clearly illustrated in FIG. 1, disposed in a lower portion of the FIB column 2.

The controller 13 connects with the liquid metal ion source 3, the condenser lens 4, the electrical aperture unit 5, the astigmatism alignment device 6, the blanker 7, the deflector 9, the secondary charged particle detector 11, and a deposition gas supply, not shown, leading to the deposition gas supply pipe 12.

Operation, Performance, and Beneficial Advantages

The above structure of the focused ion beam system 1 works to apply extraction voltage to the liquid metal ion source 3 in response to a control signal outputted from the controller 13, thereby emitting the ion beam IB from the liquid metal ion source 3 in a radial pattern.

The condenser lens 4 is responsive to the control signal from the controller 13 to convert the ion beam IB, as emitted from the liquid metal ion source 3, into the ion beam IBp in a collimated form.

The electrical aperture unit 5 is responsive to the control signal from the controller 13 to actuate the beam shielding plate units 51, 52, 53, and 54 disposed around the ion beam IB to set the diameter (i.e., an area) of the aperture AP through which the ion beam IBp passes. The electrical aperture unit 5, therefore, works to select the diameter of the aperture AP to obtain a required electrical current value (which will also be referred to as a beam current value or simply a beam current) and a required diameter (which will also be referred to as a beam diameter) of a beam reaching the upper surface of the sample S.

FIGS. 2A and 2B illustrate the aperture AP of the electrical aperture unit 5 which have changed diameters. Specifically, FIG. 2A demonstrates the aperture AP1 with a relatively large area through which a beam passes and which creates the beam current value and the beam diameter required for processing of the sample S. FIG. 2B demonstrates the aperture AP2 with a relatively small area through which a beam passes and which produces the beam current value and the beam diameter required to detect a target area on the sample S to be processed or observe a surface condition of the sample S.

The ion beam IBt which has passed through the electrical aperture unit 5 with the relatively wider aperture AP1 illustrated in FIG. 2A is, as can be seen in FIG. 1, focused by the objective lens 10 and emitted onto a processing target area on the sample S. The deposition gas supply pipe 12 delivers the deposition gas to the sample S to produce a desired deposit in the form of a layer on the upper surface of the sample S.

The ion beam IBt which has passed through the electrical aperture unit 5 with the relatively narrow aperture AP2 illustrated in FIG. 2A is, as can be seen in FIG. 1, focused by the objective lens 10 and emitted onto an observation target area on the sample S. The secondary charged particle detector 11 then captures secondary charged particles (i.e., secondary electrons or secondary ions) generated from the area on the sample S irradiated with the ion beam IBt. Data on an image of the sample S may be derived by scanning the sample S using the ion beam IBt and analyzing intensity information derived by the secondary charged particle detector 11. This enables the configuration of the surface of the sample S irradiated with the ion beam IBt to be checked. The scanning motion of the ion beam IBt is achieved by the deflector 9.

Figure 5:
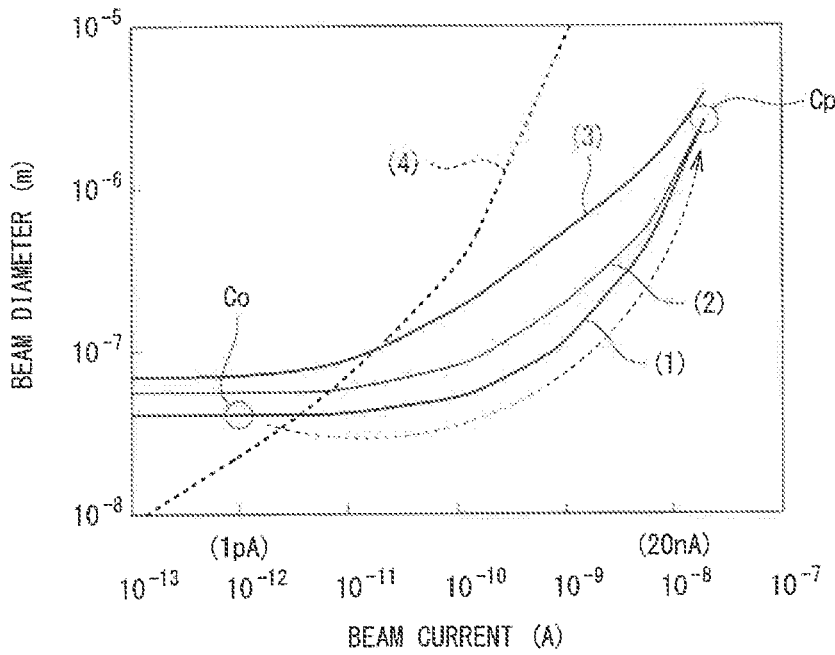
FIG. 5 is a view which represents a relation between a beam current and a beam diameter when an ion beam is generated by a focused ion beam system according to the invention.

FIG. 5 represents a relation between the current value and the diameter of the ion beam IBt reaching the surface of the sample S in the focused ion beam system 1 in this embodiment. Curves (1), (2), and (3) respectively show cases where 15 kV, 10 kV, and 5 kV are used to produce the ion beam IBp in the collimated form. The graph of FIG. 5 shows that the lower the beam current value, the smaller the beam diameter, while the higher the beam current value, the larger the beam diameter.

A lower circled portion of the curve (1) indicates a position Co which achieves the beam current value and the beam diameter suitable for observation of the surface of the sample S. Specifically, the position Co meets a condition where the beam current value is 1 pA, and the beam diameter is 40 nm. Such a condition establishes the beam current value which is low enough not to cause damage to the sample S.

An upper circled portion of the curve (1) indicates a position Cp which achieves the beam current value and the beam diameter suitable for processing the surface of the sample S. Specifically, the position Cp meets a condition where the beam current value is 20 nA, and the beam diameter is 2.5 μm. A condition of the ion beam IBp between the positions Co and Cp may be altered quickly continuously by controlling the aperture of the electrical aperture unit 5.

The focused ion beam system 1 in this embodiment produces the ion beam IBp in the collimated form using the condenser lens 4, thereby resulting in decreased imbalance in intensity (i.e., passing ion density) of the ion beam IBp in a direction perpendicular to the optical axis of the ion beam IBp. The collimated form of the ion beam IBp created by the condenser lens 4 facilitates uniform shielding of the periphery of the ion beam IBp by the beam shielding plate units 51, 52, 53, and 54 even when the beam shielding plate units 51, 52, 53, and 54 are offset from each other along the optical axis IBa, thereby minimizing a risk that the ion beam IBt may fail to be focused.

The focused ion beam system 1 in this embodiment is designed to have the beam shielding plates 5A to 5H of the electrical aperture unit 5 which are identical in number with the pole lens 6A to 6H of the astigmatism alignment device 6. The beam shielding plates 5A to 5H are, as described above, arranged in alignment with the lens 6A to 6H. This ensures the stability in regulating the beam current value without sacrificing the correction achieved by electrical field exerted on the ion beam IBt by the astigmatism alignment device 6 even when the diameter of the aperture AP of the electrical aperture unit 5 is continuously altered. This eliminates the need for the astigmatism alignment and the optical axis alignment even when the diameter of the aperture AP of the electrical aperture unit 5 is changed. The focused ion beam system 1 in this embodiment is, therefore, capable of regulating the beam current value quickly and continuously.

In this embodiment, the beam current value is, as described above, regulated continuously by the electrical aperture unit 5, thereby enabling the beam current value to be lowered, like the condition at the position Co in FIG. 5, to, for example, IpA and the astigmatism alignment voltage, the aligner voltage, or a focusing voltage (i.e., voltage applied to the condenser lens 4 or the objective lens 10) to be also controlled. The lowered beam current value, thus, minimizes a risk that sputtering may occur on the surface of the sample S to cause damage to the sample S and ensures the stability in beam adjustment with high accuracy. The above condition enables only the beam current value to be increased without altering the focusing condition even when the diameter of the aperture AP is increased by the electrical aperture unit 5. This embodiment is, therefore, capable of processing the sample S immediately after the condition at the position Cp in FIG. 5 is met.

The focused ion beam system 1 in this embodiment may be configured to have electrical aperture unit 5 equipped with the beam shielding plates 5A to 5H which are arranged in alignment with electrodes of an aligner, not shown, and the deflector 9 and movable in eight directions A1, A2, A3, and A4 to control the beam current value in addition to the astigmatism alignment device 6, thereby further facilitating the adjustment of the beam current value regardless of the astigmatism alignment.

The focused ion beam system 1 in this embodiment works to convert the ion beam IB through the condenser lens 4 into the collimated ion beam IBp, thereby enabling the ion beam IBp to have an outer periphery narrowed uniformly to decrease the diameter of the ion beam IBp even when the beam shielding plate units 51, 52, 53, and 54 are offset from each other in the longitudinal direction of the optical axis IBa.

Usually, it takes much time to perform an adjustment of the astigmatism alignment device 6 to decrease the diameter of the ion beam IBp for observing the surface of the sample S, thus resulting in a risk of damage to the sample S. The focused ion beam system 1 in this embodiment is, however, designed to move only the electrical aperture unit 5 without altering the operating condition of the astigmatism alignment device 6, thereby eliminating the need for the adjustment of the astigmatism alignment device 6. This enables the surface of the sample S to be examined quickly in a short time.

Second Embodiment

Figure 6:
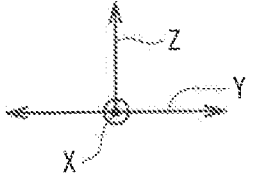
FIG. 6 is an explanatory view which schematically illustrates a focused ion beam system according to the second embodiment of the invention.

FIG. 6 schematically illustrates the structure of the focused ion beam system 1A in the second embodiment of the invention. The structure of the focused ion beam system 1A is substantially the same as that of the focused ion beam system 1 in the first embodiment except that the focused ion beam system 1A is equipped with the selective aperture plate 14.

Figure 7:
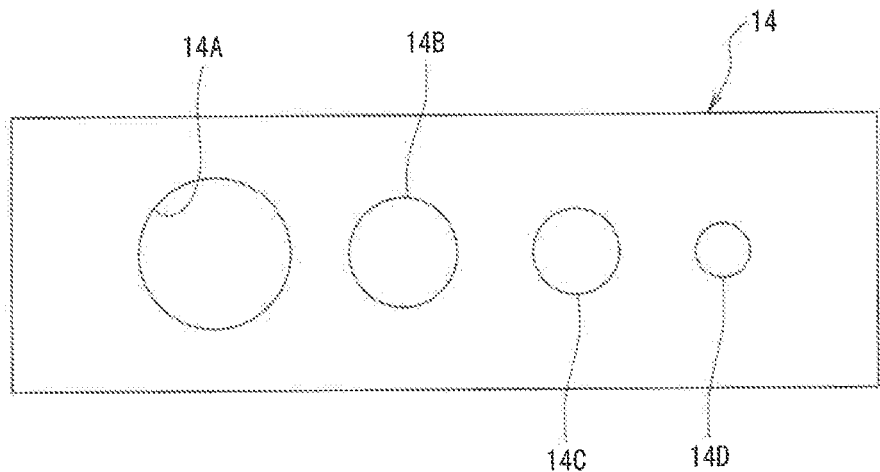
FIG. 7 is a plane view which illustrates a selective aperture plate installed in a focused ion beam system according to the second embodiment of the invention.

The selective aperture plate 14 is, as clearly illustrated in FIG. 6, arranged optically downstream of the electrical aperture unit 5. The selective aperture plate 14 is, as illustrated in FIG. 7, made of a metal plate which has the ability to block beams and also has the apertures 14A, 14B, 14C, and 14D aligned with each other in a lengthwise direction thereof. The apertures 14A, 14B, 14C, and 14D are shaped to have diameters which differ from each other in the illustrated order. The selective aperture plate 14 is oriented to have the apertures 14A, 14B, 14C, and 14D arranged in alignment with the direction A1.

In this embodiment, the adjustment of the diameter of the ion beam IBp is achieved by the selective aperture plate 14 in addition to the electrical aperture unit 5. The selective aperture plate 14 is used in a beam mode where the ion beam IB emitted from the liquid metal ion source 3 is focused by the condenser lens 4 on or near the selective aperture plate 14. In the beam mode, the aperture AP is adjusted to have an increased diameter to eliminate adverse effects of the electrical aperture unit 5 on the selective aperture plate 14. One of the apertures 14A, 14B, 14C, and 14D of the selective aperture plate 14 is selected. The selective aperture plate 14 is then moved by an actuator, not shown, to control the beam current value.

The curve (4) in FIG. 5 continuously represents a relation between the beam current value and the beam diameter when the voltage applied to the liquid metal ion source 3 is 15 kV, and one of the apertures 14A, 14B, 14C, and 14D of the selective aperture plate 14 is selected. In the beam mode where the ion beam IB is focused near the selective aperture plate 14, use of the selective aperture plate 14 enables the beam current for observation of the sample S to be decreased and the diameter of the ion beam IB to be also decreased. Therefore, when it is required to observe the surface of the sample S, the selective aperture plate 14 may work to produce the ion beam IB which has a greatly lowered beam current and a decreased beam diameter.

Other Embodiments

Although the embodiments of the present invention have been described, it should not be understood that the statements and drawings forming part of the disclosure of the embodiments limit the present invention. Various alternative embodiments, examples and operational techniques will become apparent to those skilled in the art from this disclosure.

In the above embodiments, the number of the beam shielding plates 5A to 5H of the electrical aperture unit 5 is set to be identical with that of the pole lens 6A to 6H of the astigmatism alignment device 6, but however, the electrical aperture unit 5 may be designed to have as many beam shielding plates as electrodes of an aligner, not shown, and the deflector 9. It is advisable that the number of the electrodes of the aligner be identical with that of the pole lens of the astigmatism alignment device 6. The number of the beam shielding plates 5A to 5H is eight in the above embodiments, but however, it may be optional as long as it is more than one.

In the above embodiments, the deposition gas supply pipe 12 is arranged beneath the FIB column 2 to deliver deposition gas to the sample S, but however, it may be designed to supply etching gas to the sample S.

In each of the above embodiments, the ion beam current may be increased to sputter the surface of the sample S. Such a sputtering technique may be used to utilize each of the focused ion beam systems 1 and 1A as a correction machine for photomasks.

In each of the above embodiments, the beam shielding plate units 51, 52, 53, and 54 are designed to have the pairs of beam shielding plates 5A and 5E, 5B and 5F, 5C and 5G, and 5D and 5H. Each of the beam shielding plate units 51, 52, 53, and 54 has the corresponding pair of beam shielding plates 5A and 5E, 5B and 5F, 5C and 5G, or 5D and 5H which are moved synchronously at the same distance from the optical axis IBa of the ion beam IBp, but however, they may be moved asynchronously as long as they complete the movement thereof before the ion beam IBt starts being used to process or observe the surface of the sample S.

EXPLANATION OF REFERENCE SYMBOLS

AP, AP1, AP2 aperture
IB ion beam
Iba optical axis of ion beam
IBp collimated ion beam
IBt ion beam passed
1, 1A focused ion beam system 2 focused ion beam column (FIB column)
3 liquid metal ion source
4 condenser lens
5 electrical aperture unit
5A to 5G ion beam shielding plate
6 astigmatism alignment device
6A to 6H pole lens
7 blanker
8 blanking aperture
9 deflector
10 objective lens
11 secondary charged particle detector
12 deposition gas supply pipe
13 controller
14 selective aperture plate
14A, 14B, 14C, 14D aperture
15 substrate support base
51 52, 53, 54 beam shielding plate units

What is claimed is:

1. A focused ion beam system comprising:
a liquid metal ion source;
a condenser lens which processes an ion beam generated by the liquid metal ion source; and
an objective lens which focuses the ion beam which has passed through the condenser lens and emits the ion beam onto a surface of a sample, wherein
the condenser lens works to process the ion beam into a collimated form,
an electrical aperture unit is disposed between the condenser lens and the objective lens, the electrical aperture unit working to alter an area through which the ion beam, as processed by the condenser lens, passes to control a diameter of the ion beam,
the electrical aperture unit includes a plurality of beam shielding plate units, each of the beam shielding plate units being equipped with a p pair of beam shielding plates which are diametrically opposed to each other across the ion beam which has passed through the condenser lens and movable in a direction perpendicular to an optical axis of the ion beam,
the beam shielding plates of the beam shielding plate units are arranged around the ion beam to define the area through which the ion beam passes,
the plurality of beam shielding plate units are offset from each other in a direction in which the optical axis of the ion beam extends, and
an astigmatism alignment device is disposed downstream of the electrical aperture unit, the astigmatism alignment device including a plurality of pole lenses arranged around the ion beam, and wherein the electrical aperture unit includes the beam shielding plates which are identical in number with the pole lenses.

2. The focused ion beam system as set forth in claim 1, wherein the electrical aperture unit includes the four beam shielding plate units which are located at an angular interval of 45 degrees away from each other around the optical axis of the ion beam in a circumferential direction of the ion beam, as viewed in the direction in which the optical axis of the ion beam extends.

3. The focused ion beam system as set forth in claim 1, wherein the beam shielding plate units are configured to have the beam shielding plates synchronously movable close to or away from each other at the same distance from the optical axis of the ion beam.

4. The focused ion beam system as set forth in claim 1, wherein the beam shielding plate units are synchronously movable.

5. The focused ion beam system as set forth in claim 1, wherein the electrical aperture unit works to continuously alter the area through which the ion beam passes.

6. The focused ion beam system as set forth in claim 1, wherein the beam shielding plate units are arranged to define an aperture of a polygonal shape whose peripheral edge is regularly altered around the optical axis of the ion beam in a direction in which an electrical field is controlled by the astigmatism alignment device, viewed in the direction in which the optical axis of the ion beam extends.

7. The focused ion beam system as set forth in claim 1, wherein each of the beam shielding plates of the electrical aperture unit is arranged in alignment with a respective one of the pole lenses, as viewed in the direction in which the optical axis of the ion beam extends.

8. The focused ion beam system as set forth in claim 1, further comprises a selective aperture plate which has formed therein a plurality of apertures whose diameter are different from each other to selectively control the diameter of the ion beam.

* * * * *